Figures 1, 2:
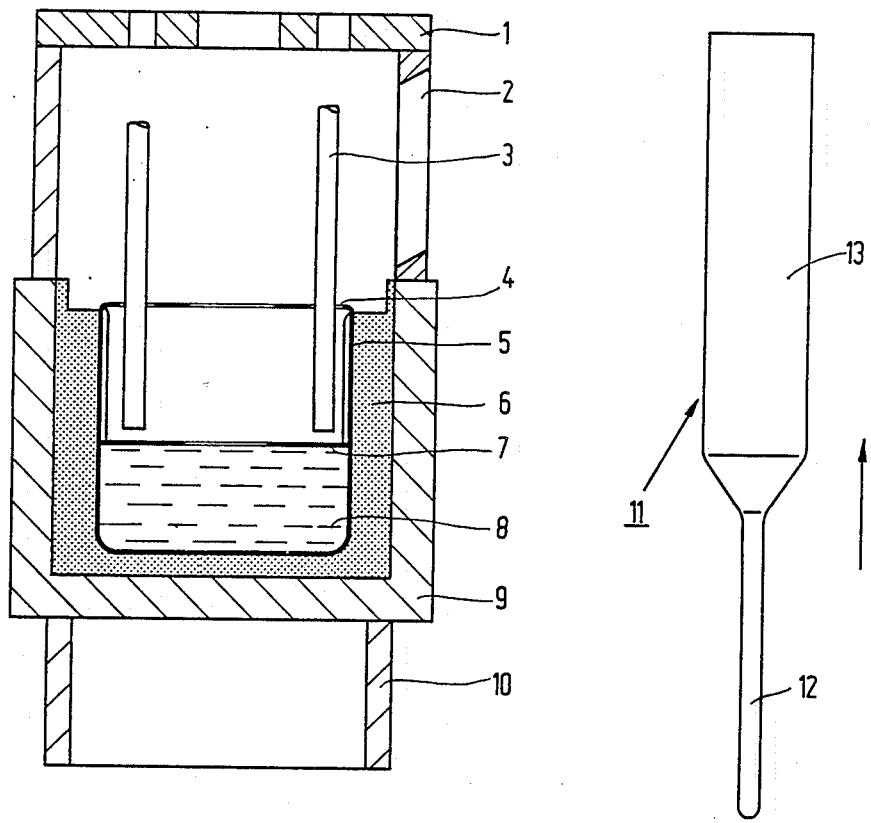

United States Patent [19]

Van Hoof et al.

[11] Patent Number: 4,961,919
[45] Date of Patent: Oct. 9, 1990

[54] MONOCRYSTALLINE MATERIAL HAVING GARNET STRUCTURE

[75] Inventors: Leonardus A.H. Van Hoof, Eindhoven, Netherlands; Dieter Mateika, Ellerbek; Horst Laudan, Hamburg, both of Fed. Rep. of Germany; Johannes A. Pistorius; Jan Haisma, both of Eindhoven, Netherlands

[73] Assignee: U.S. Philips Corporation, New York, N.Y.

[21] Appl. No.: 294,311

[22] Filed: Jan. 6, 1989

[30] Foreign Application Priority Data

Jan. 25, 1988 [NL] Netherlands .................. 8800155

[51] Int. Cl.$^5$ ............................................. C01G 23/00
[52] U.S. Cl. ................... 423/598; 423/599; 156/DIG. 61; 156/DIG. 64; 156/DIG. 67; 156/DIG. 75
[58] Field of Search .............................. 423/598, 599; 156/DIG. 61, DIG. 64, DIG. 67, DIG. 75, 616.2, 620.3; 148/DIG. 81, DIG. 150; 437/84

[56] References Cited

U.S. PATENT DOCUMENTS

| | | | |
|---|---|---|---|
| 4,350,559 | 9/1982 | Boudot et al. | 156/DIG. 63 |
| 4,627,064 | 12/1986 | Auzel et al. | 252/301.17 |
| 4,708,763 | 11/1987 | van Hoof | 156/604 |
| 4,824,598 | 4/1989 | Stokowski | 156/617.1 |

*Primary Examiner*—Melvyn J. Andrews
*Attorney, Agent, or Firm*—Norman N. Spain

[57] ABSTRACT

A description is given of the composition and preparation of single phase crystals having a garnet structure and a lattice constant smaller than 11.9 Å. The garnets correspond to the formula $$\{Mn_{3-a-b}Mg_aM_b\}[Al_{2-c}M'_c](Ge_{3-d-e}Si_dM''_e)O_{12} \quad (I)$$

wherein
$0.0 \leq a \leq 0.4$
$0.0 \leq b \leq 0.4$
$0.0 \leq c \leq 0.2$
$0.0 \leq d \leq 0.5$
$0.0 \leq e \leq 0.6$
$0.2 \leq a+d \leq 0.8$.

2 Claims, 1 Drawing Sheet

MONOCRYSTALLINE MATERIAL HAVING GARNET STRUCTURE

The invention relates to a monocrystalline material having a garnet structure. The invention also relates to methods of manufacturing a monocrystalline material having a garnet structure.

Such a material is known from, amongst others, J. Cryst. Growth. 83 466 (1987). In this literature reference a description is given of a garnet having a composition which corresponds to the formula $\{Yb_{2.5}Er_{0.5}\}[Al_2](Al_3)O_{12}$. These and similar garnets are used, amongst others, as substrate material on which other material can be grown epitaxially, such as, for example, the semiconductors Si, GaAs, Ge and InP. Due to their large lattice constant garnets have a crystal lattice which in substantially free of defects. The materials grown epitaxially on these garnets are found to have deposited as a monocrystalline layer substantially without lattice faults.

Another advantage of the use of garnets as a substrate resides in that the lattice constant can be adjusted. The magnitude of the lattice constant of the garnet can be varied within certain limits by (partly) substituting one or more of the elements A, B and C which occupy the dodecahedral {A}, the octahedral [B] and the tetrahedral sites (C) in the garnet $\{A_3\}[B_2](C_3)O_{12}$.

It is further known from the said literature reference that the lattice constant of the garnet and the material to be grown thereon epitaxially must fulfil certain so-called "matching" relations. In practice the lattice constant of the material to be grown is fixed. By a suitable choice of the constituent elements a garnet substrate having a predetermined lattice constant can be obtained, such that the material to be grown thereon epitaxially can be deposited with a specific preferred monocrystalline orientation.

As stated in the said literature reference, the synthetic crystalline garnets described sofar have the disadvantage that the magnitude of the lattice constant is limited to a range of from 11.9 Å to 13.0 Å. Garnets having a lattice constant smaller than 11.9 Å substantially increase the positibility of using these garnet compounds as substrates for the material to be grown thereon in a monocrystalline, epitaxial manner. For example, calculations have shown that the lattice constants of the semiconductors Si, GaAs and InP fulfil relatively simple "matching" relations if garnets are used having a lattice constant between 11.5 and 11.90 Å.

It is an object of the invention to provide a monocrystalline material having a garnet structure and a lattice constant smaller than 11.9 Å.

This object is achieved by means of a monocrystalline material having a garnet structure, which is further characterized in that the composition of the material corresponds to formula I

  (I)

wherein M is one element selected from the group consisting of $In^{3+}$, $Li^+$, $Fe^{2+}$, $Sc^{3+}$, $Zr^{4+}$ and $Hf^{4+}$; M' is one element selected from the group consisting of $Ge^{4+}$ and $Ti^{4+}$ and M'' is one element selected from the group consisting of $B^{3+}$ and $Al^{3+}$; and wherein $0.0 \leq a \leq 0.4$
$0.0 \leq b \leq 0.4$
$0.0 \leq c \leq 0.2$
$0.0 \leq d \leq 0.5$
$0.0 \leq e \leq 0.6$.
$0.2 \leq a+d \leq 0.8$.

Crystal-growth experiments have shown that when the value of one or more of the indices a, b, c, d and e is larger than the upper limit indicated, the crystalline material comprises other crystal phases besides the garnet structure. Further it has been found that single-phase crystals having a garnet structure are only formed when the sum of the indices a and d is larger than or equal to 0.2 and smaller than or equal to 0.8.

In the garnets in accordance with the invention, the dodecahedral sites are occupied by $Mn^{2+}$ or by $Mn^{2+}$ together with one or more of the elements selected from the group consisting of $Mg^{2+}$ and M; the octahedral sites are occupied by $Al^{3+}$ or by $Al^{3+}$ and one or more of the elements selected from the group M', and the tetrahedral sites are occupied by $Ge^{4+}$ or by $Ge^{4+}$ together with one or more of the elements selected from the group consisting of $Si^{4+}$ and M''. On account of the required electric neutrality of the said garnets the composition of the compound in accordance with formula I cannot be selected at random. The elements M, M' and M'' must be selected within the limits indicated by the indices a-e and in a ratio relative to each other, such that charge compensation occurs. In other words: the compound to be formed in accordance with formula I will have to be electrically neutral.

A preferred embodiment, the monocrystalline garnet material in accordance with the invention is characterized in that the composition of the material corresponds to formula II

  (II)

wherein
$0.0 \leq a \leq 0.4$
$0.0 \leq d \leq 0.5$
$0.2 \leq a+d \leq 0.8$.

Crystal-growth experiments have shown that garnet compounds having the composition in accordance with formula II can be grown in a relatively simple manner. This can partly be attributed to the fact that the ion radii of the elements of which the garnet is composed correspond well to the space available for these elements in the garnet on the dodecahedral octahedral and tetrahedral sites.

The invention also relates to a method of manufacturing monocrystalline material. Crystal-growth experiments have shown that a customary method of growing crystals which is known per se, such as the method according to Czochralski, as described in, amongst others, "Magnetic Garnets, viewing tracts in pure and applied physics" (Vol. 5, Braunszweig 1981, pp. 530-539) is not optimally suitable for the manufacture of the garnets in accordance with the invention. The crystal-growth method according to Czochralski in particular has the disadvantage that the garnets grown in accordance with the method often exhibit so-called spiral growth. In a first method in accordance with the invention this disadvantage is overcome.

To this end the first method in accordance with the invention is characterized in that the oxides and/or carbonates of the elements of which the intended garnet is composed are mixed in molar ratios which correspond to the composition of the garnet, in that the mixture is sintered for several hours and subsequently melted, in that a gas atmosphere is formed over the melt, which gas atmosphere has an oxygen content of at least 10 and at most 40% by volume, and in that, finally, monocrystalline material is pulled out of the melt by means of a seed crystal.

The oxygen content in the gas atmosphere over the melt serves to reduce the evaporation of $GeO_2$. It has been found, that too small a quantity of oxygen, i.e. less than 10% by volume, in the gas atmosphere over the melt leads to a rapid evaporation of $GeO_2$. This evaporation of $GeO_2$ during the crystal growth brings about a change in the concentration of in particular $GeO_2$ in the melt. This results in an undesired concentration gradient of Ge in the garnet crystal to be grown. On the other hand, too high an oxygen content, i.e. more than 40% by volume, in the gas atmosphere over the melt leads to oxidation of $Mn^{2+}$. This leads to the formation of other phases than the garnet structure in the garnet crystal to be grown. For this reason the gas atmosphere over the melt has an oxygen content of between 10 and 40% by volume.

The invention further relates to a second method of preparing monocrystalline material. Crystal-growth experiments have shown that a known, customary crystal growth method used for the manufacture of garnets, such as the Bridgman method, which is essentially described in European Patent Specification No. 0174672, is not optimally suitable for the manufacture of the garnets in accordance with the invention.

The second method in accordance with the invention is characterized in that the oxides and/or carbonates of the elements of which the intended garnet is composed are mixed in a crucible in the molar ratios corresponding to the garnet composition, said crucible being provided with a tube containing small crystals of the intended garnet, in that the mixture is premelted while the seed tube is cooled, in that a gas atmosphere is formed directly over the melt, which gas atmosphere has an oxygen content of at least 10 and at most 40% by volume, in that the mixture is melted such that a temperature gradient is formed over the combined length of the melting crucible and the seed tube, the melting temperature of the mixture being attained at the location of the seed tube, and in that the temperature gradient is displaced towards the melting crucible.

In comparison with the first method in accordance with the invention, the second method in accordance with the invention has the additional advantage that evaporation of $GeO_2$ can be controlled more readily.

It has been found that the second method in accordance with the invention enables the temperature gradient over the melting zone to be reduced relative to that of the first method in accordance with the invention. Consequently when the melt is heated in accordance with the second method of the invention, there is less evaporation of some garnet constituent than in the case of the first method in accordance with the invention. The fact that in the second method the melt hardly contacts the surrounding gas atmosphere also ensures that substantially no evaporation of volatile components of the garnet takes place.

The invention will be explained in greater detail by means of exemplary embodiments and with reference to a drawing, in which FIG. 1 is a diagrammatic representation of the device used to carry out a first method in accordance with the invention, FIG. 2 is a representation of a melting crucible provided with a seed tube as used in the second method in accordance with the invention.

EXAMPLE I

Carbonates and oxides of the elements of which the intended garnet is composed, namely $MnCO_3$ (109.21 g), MgO (5.58 g), $Al_2O_3$ (34.45 g), $GeO_2$ (91.59 g) and $SiO_2$ (8.03 g) are mixed, pressed into a cylindrical shape and sintered in air at 1000° C. for several hours. Subsequently, the sintered body is melted in an induction-heated platinum melting crucible at approximately 1400° C. FIG. 1 shows the device used for growing the crystals. A platinum melting crucible (5) embedded in $ZrO_2$ granulate (6) is located in a ceramic melting crucible (9). A melt (8) is covered with a platinum cover (7) in which a bore having a diameter of 20 mm has been formed. Another platinum cover (4) having three bores further seals the inner melting crucible. Two gas inlet tubes (3) are provided just above the platinum cover (7). The ceramic melting crucible (9) is covered with a lid (1) which is located on an intermediate member of $Al_2O_3$. The monocrystalline garnet is pulled out of the melt by means of a cylindrical seed crystal. Through the gas inlet tubes (3) a gas mixture consisting of 70% of $N_2$ and 30% of $O_2$ is provided over the melt. The crystal growth rate is 1 mm per hour. During the growth operation the crystal is rotated.

The crystal grown in accordance with this method has a length of 40 mm and a cross-section of 15 mm. The crystal is dark red and has a lattice constant of 11.84 Å. The composition of the crystal corresponds to the composition of the melt $Mn_{2.6}Mg_{0.4}Al_2Ge_{2.6}Si_{0.4}O_{12}$, within an analysis accuracy of 1%.

EXAMPLE II

Carbonates and oxides of the elements of which the intended garnet is composed, namely $MnCO_3$ (41.93 g), MgO (2.26 g), $Al_2O_3$ (14.30 g), $GeO_2$ (38.14 g) and $SiO_2$ (3.38 g) are mixed and pressed and subsequently premelted in a platinum crucible at 1395° C. for 30 minutes. Premelting takes place in a platinum crucible (11) which is provided with a seed tube (12) on the bottom side, as is shown in FIG. 2, the seed tube containing seed crystals. During premelting the seed tube (12) is cooled to a temperature below the melting temperature of the garnet material. Subsequently, a temperature gradient of 8° C./cm$^2$ is established over the platinum crucible and the seed tube, such that the melting temperature of the garnet material is attained approximately half-way the seed tube (12). In this situation, the crystals present above this location in the seed tube and the higher positioned premelted body (13) are melted. The temperature gradient is displaced (see arrow) in the direction of the premelted body at a rate of 2 mm per hour, such that a slow crystallisation of the melted seed crystals and, subsequently, of the premelted body takes place. In this way a monocrystalline garnet material having a composition which corresponds to the formula $Mn_{2.6}MgO_4Al_{2.0}Ge_{2.6}Si_{0.4}O_{12}$ is obtained, said material having a diameter of 20 mm and a length of 60 mm. Growth took place in a gas atmosphere comprising 10% by volume of $O_2$ and 90% by volume of $N_2$. The lattice constant of the said crystal was 11.85 Å.

Table I lists a number of compositions of garnets in accordance with the invention and their lattice constants (No. 1-10), which monocrystalline materials all have a garnet structure; and a number of compositions of compounds (No. 11-18) the grown crystals of which were found to be multiphase. In addition to the phase garnet phase other crystal phases which were not further researched were found to be present.

| No | Composition crystalline material | Crystal phase(s) | Lattice constant Å |
|---|---|---|---|
| 1 | $(Mn_{2.4}Mg_{0.4}In_{0.2})[Al_2](Ge_{2.4}Si_{0.4}B_{0.2})O_{12}$ | Garnet | 11.81 |
| 2 | $(Mn_{2.4}Mg_{0.4}In_{0.2})[Al_2](Ge_{2.4}Si_{0.4}Al_{0.2})O_{12}$ | " | 11.83 |
| 3 | $(Mn_{2.4}Mg_{0.4}Sc_{0.2})[Al_2](Ge_{2.4}Si_{0.4}Al_{0.2})O_{12}$ | " | 11.80 |
| 4 | $(Mn_{2.2}Mg_{0.4}Sc_{0.4})[Al_2](Ge_{2.2}Si_{0.4}B_{0.4})O_{12}$ | " | 11.85 |
| 5 | $(Mn_{2.4}Mg_{0.4}Li_{0.2}[Al_{1.8}Ge_2](Ge_{2.6}Si_{0.4})O_{12}$ | " | 11.83 |
| 6 | $(Mn_{2.4}Mg_{0.4}Fe_{0.2})[Al_2](Ge_{2.6}Si_{0.4})O_{12}$ | " | 11.84 |
| 7 | $(Mn_{2.8}Mg_{0.2})[Al_2](Ge_3)O_{12}$ | " | 11.87 |
| 8 | $(Mn_{2.8}Mg_{0.2})[Al_2](Ge_{2.8}Si_{0.2})O_{12}$ | " | 11.86 |
| 9 | $(Mn_{2.8}Mg_{0.2})[Al_2](Ge_{2.6}Si_{0.4})O_{12}$ | " | 11.83 |
| 10 | $(Mn_3)[Al_2](Ge_{2.5}Si_{0.5})O_{12}$ | " | 11.84 |
| 11 | $(Mn_3)[Al_2](Ge_3)O_{12}$ | Garnet + ? | — |
| 12 | $(Mn_{2.5}Mg_{0.5})[Al_2](Ge_3)O_{12}$ | " | — |
| 13 | $(Mn_2Mg_1[Al_2](Ge_3)O_{12}$ | " | — |
| 14 | $(Mn_{2.4}Mg_{0.6})[Al](Ge_{2.4}Si_{0.6})O_{12}$ | " | — |
| 15 | $(Mn_{2.2}Mg_{0.8})[Al_2](Ge_{2.2}Si_{0.8})O_{12}$ | " | — |
| 16 | $(Mn_{2.5}Mg_{0.5})[Al_2](Ge_2Si)O_{12}$ | " | — |
| 17 | $(Mn_2Mg)[Al_2](Ge_{2.5}Si_{0.5})O_{12}$ | " | — |
| 18 | $(Mn_3)[Al_2](Ge_2Si)O_{12}$ | " | — |

We claim:

1. A monocrystalline material having a garnet structure, characterized in that the lattice constant of the material is smaller than 11.9 Å and the composition of the material corresponds to the formula $$\{Mn_{3-a-b}Mg_aM_b\}[Al_{2-c}M'_c](Ge_{3-d-e}Si_dM''_e)O_{12}$$

wherein

M is at least one element selected from the group consisting of $In^{3+}$; $Li^+$; $Fe^{2+}$; $Sc^{3+}$; $Zr^{4+}$ and $Hf^{4+}$;

M' is at least one element selected from the group consisting of $Ge^{4+}$ and $Ti^{4+}$ M'' is at least one element selected from the group consisting of $B^{3+}$ and $Al^{3+}$ and, wherein $0.0 \leq a \leq 0.4$
$0.0 \leq b \leq 0.4$
$0.0 \leq c \leq 0.2$
$0.0 \leq d \leq 0.5$
$0.0 \leq e \leq 0.6$
$0.2 \leq a+d \leq 0.8$.

2. A monocrystalline material as claimed in claim 1, characterized in that the composition of the material corresponds to the formula $$\{Mn_{3-a}Mg_a\}[Al_2](Ge_{3-d}Si_d)O_{12}$$

wherein $0.2 \leq a \leq 0.4$
$0.2 \leq d \leq 0.5$
$0.2 \leq a+d \leq 0.8$.

* * * * *